(12) United States Patent
Honda

(10) Patent No.: US 11,342,279 B2
(45) Date of Patent: May 24, 2022

(54) SEMICONDUCTOR DEVICE AND AMPLIFIER HAVING BONDING WIRE AND CONDUCTIVE MEMBER

(71) Applicant: SUMITOMO ELECTRIC INDUSTRIES, LTD., Osaka (JP)

(72) Inventor: Ayumu Honda, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/167,213

(22) Filed: Feb. 4, 2021

(65) Prior Publication Data

US 2021/0249360 A1 Aug. 12, 2021

(30) Foreign Application Priority Data

Feb. 10, 2020 (JP) .............................. JP2020-020547

(51) Int. Cl.
| | |
|---|---|
| *H01L 23/552* | (2006.01) |
| *H01L 23/492* | (2006.01) |
| *H01L 25/16* | (2006.01) |
| *H01L 23/00* | (2006.01) |
| *H01L 23/04* | (2006.01) |
| *H03F 3/16* | (2006.01) |
| *H03F 1/56* | (2006.01) |

(52) U.S. Cl.
CPC .......... *H01L 23/552* (2013.01); *H01L 23/041* (2013.01); *H01L 23/492* (2013.01); *H01L 24/48* (2013.01); *H01L 25/16* (2013.01); *H03F 3/16* (2013.01); *H01L 2224/48195* (2013.01); *H03F 1/565* (2013.01); *H03F 2200/222* (2013.01); *H03F 2200/318* (2013.01); *H03F 2200/387* (2013.01)

(58) Field of Classification Search
CPC ....................................................... H01L 23/041
USPC ........................................................... 257/692
See application file for complete search history.

(56) References Cited

U.S. PATENT DOCUMENTS

| | | | | |
|---|---|---|---|---|
| 9,007,129 | B2 * | 4/2015 | van Zuijlen | ............ H03F 3/195 |
| | | | | 330/307 |
| 10,506,704 | B1 * | 12/2019 | Embar | .................. H05K 1/0216 |
| 2018/0143463 | A1 * | 5/2018 | Han | ........................ H01L 23/66 |

FOREIGN PATENT DOCUMENTS

JP 2012-151694 8/2012

* cited by examiner

*Primary Examiner* — Ajay Arora
(74) *Attorney, Agent, or Firm* — IPUSA, PLLC

(57) ABSTRACT

A semiconductor device includes a ground plane, a capacitor disposed on the ground plane and having a first top surface, a semiconductor chip disposed on the ground plane and having a second top surface, a bonding wire connecting the first top surface and the second top surface, and a conductive member disposed on the ground plane. The conductive member is electrically connected to the ground plane. The bonding wire extends in a first direction in a planar view normal to the ground plane. The conductive member is positioned apart from the bonding wire in a second direction orthogonally intersecting in the planar view with the first direction.

10 Claims, 10 Drawing Sheets

| h0 [mm] | d1,d2 [mm] | L-VALUE [nH] | REDUCTION OF L-VALUE [nH] |
|---|---|---|---|
| 0.27 | 0.15 | 0.459 | 0.058 |
| 0.27 | 0.20 | 0.480 | 0.037 |
| 0.27 | 0.25 | 0.489 | 0.028 |
| 0.27 | 0.27 | 0.493 | 0.024 |
| 0.27 | 0.30 | 0.499 | 0.018 |
| 0.27 | ∞ | 0.517 | - |

SEMICONDUCTOR DEVICE AND AMPLIFIER HAVING BONDING WIRE AND CONDUCTIVE MEMBER

FIELD

The present disclosure relates to a semiconductor device.

CROSS REFERENCE TO RELATED APPLICATIONS

The present application is based on and claims priority to Japanese Patent Application No. 2020-020547, filed on Feb. 10, 2020, the entire contents of which are incorporated herein by reference.

BACKGROUND

Japanese Unexamined Patent Application Publication No. 2012-151694 (Patent Document 1) discloses an electronic circuit including a dielectric substrate provided on a surface of a ground conductor, a semiconductor substrate provided on the surface of the ground conductor, a bonding wire connecting between a wiring pattern on the dielectric substrate and an electrode on the semiconductor substrate, and a metal block electrically connected to the surface of the ground conductor. In this electronic circuit, the metal block is positioned below the bonding wire.

Phase of a signal passing through a bonding wire may shift in response to an increase of inductance of the bonding wire. In such a case, desired signal transmission characteristics may not be obtained.

SUMMARY

One or more aspects of the present disclosure are directed to providing a semiconductor device and an amplifier capable of reducing the inductance of a bonding wire.

According to one aspect of the embodiments of the present disclosure, a semiconductor device includes a ground plane, a capacitor disposed on the ground plane, the capacitor having a first top surface, a semiconductor chip disposed on the ground plane, the semiconductor chip having a second top surface, a bonding wire connecting the first top surface and the second top surface, and a conductive member disposed on the ground plane, the conductive member being electrically connected to the ground plane. The bonding wire extends in a first direction in a planar view normal to the ground plane. The conductive member is positioned apart from the bonding wire in a second direction orthogonally intersecting in the planar view with the first direction.

According to another aspect of the embodiments of the present disclosure, an amplifier includes a ground plane; a first capacitor disposed on the ground plane, the first capacitor having a first top surface; a first transistor disposed on the ground plane, the first transistor having a second top surface; at least one first bonding wire connecting the first top surface and the second top surface; a conductive member disposed on the ground plane, the conductive member being electrically connected to the ground plane; a second capacitor disposed on the ground plane, the second capacitor having a third top surface; a second transistor disposed on the ground plane, the second transistor having a fourth top surface; a plurality of second bonding wires connecting the third top surface and the fourth top surface; and a substrate disposed on the ground plane, the substrate having an opening extending therethrough to the ground plane. The conductive member, the first capacitor, the first transistor, the first bonding wire, the second capacitor, the second transistor, and the second bonding wires are arranged inside the opening. The first transistor and the second transistor are connected in parallel to each other via the first capacitor and the second capacitor. The first transistor has a lower output power than the second transistor. The at least one first bonding wire is fewer in number than the second bonding wires. The first bonding wire extends in a first direction in a planar view normal to the ground plane. The conductive member is positioned apart from the bonding wire in a second direction orthogonally intersecting in the planar view with the first direction.

DESCRIPTION OF THE EMBODIMENTS

Figure 1:
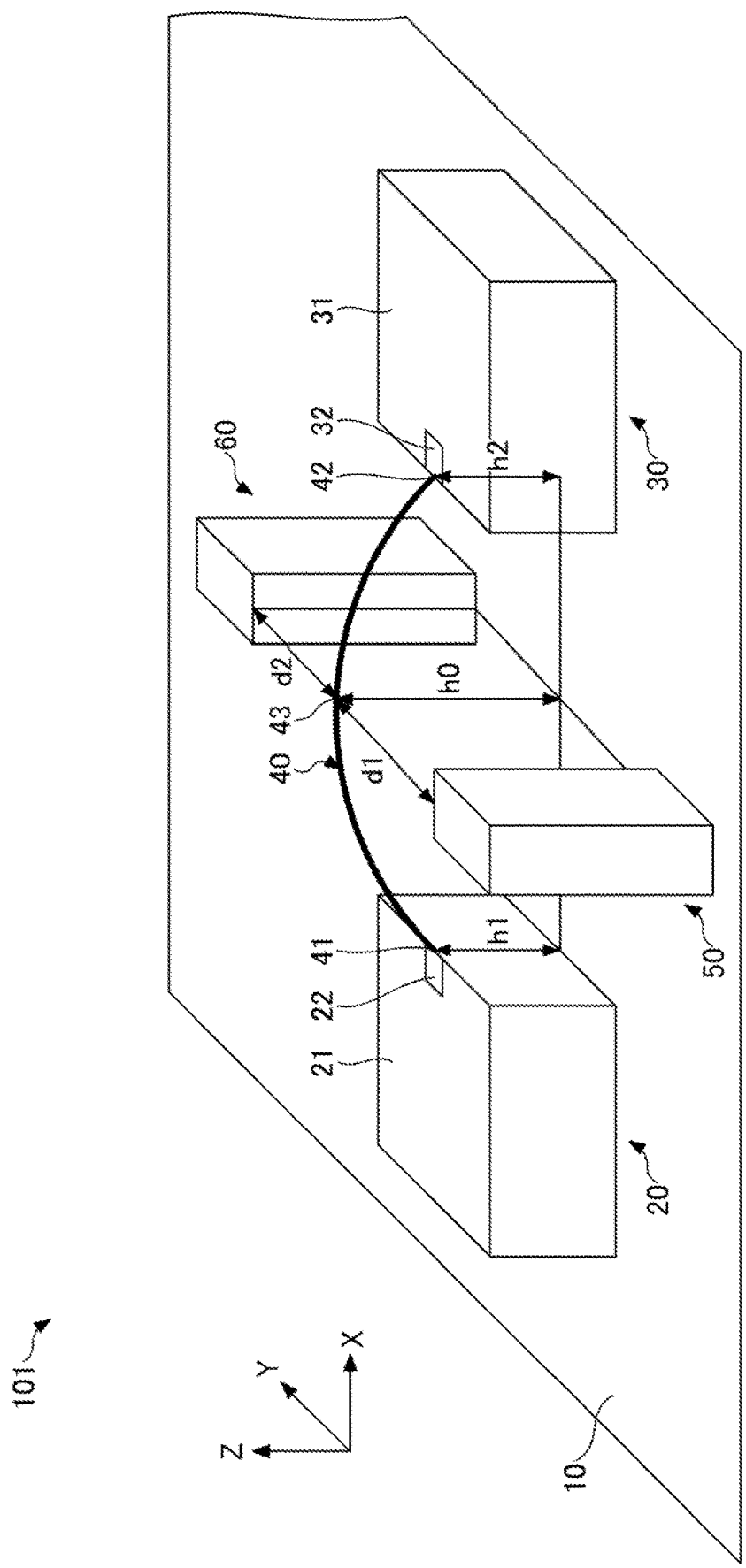
FIG. 1 is a perspective view showing a configuration example of a semiconductor device according to one embodiment.

Embodiments of the present disclosure will be described in the following.

The embodiments of the present disclosure will be described in an arbitrary order. In the following description, the same elements or corresponding elements will be described using the same reference numerals, and a repeated description of the same or corresponding elements will be omitted.

Embodiments of Present Disclosure (1) A semiconductor device according to one embodiment of the present disclosure includes a ground plane, a capacitor provided on the ground plane and having a first top surface, a semiconductor chip provided on the ground plane and having a second top surface, a bonding wire connecting between the first top surface and the second top surface, and a conductive member provided on the ground plane and electrically connected to the ground plane. The bonding wire extends in a first direction in a planar view with respect to the ground plane. The conductive member is located away from the bonding wire in a second direction orthogonally intersecting with the first direction in the planar view.

In the semiconductor device, since the conductive member is located away from the bonding wire in the second direction in the planar view, at least part of lines of magnetic force (magnetic field) generated concentrically around the bonding wire is blocked by the conductive member. Blocking at least part of the magnetic field generated by the bonding wire with the conductive member enables the inductance of the bonding wire to be reduced.

The bonding wire is curved so as to project upward. Therefore, in a configuration in which a metal block is located directly below the bonding wire (e.g., FIG. 7 of Patent Document 1), the upper end of the metal block needs to be deformed into a curved shape so as to project upward for effectively reducing inductance of the bonding wire. However, such a curved shape tends to increase manufacturing difficulty and cost. On the other hand, in the above semiconductor device, since the conductive member is located away from the bonding wire in the second direction, the conductive member is easily brought close to the bonding wire, even near a top portion of the bonding wire where the bonding wire is protruding upward, without a deformation of the conductive member. Therefore, the above semiconductor device can easily reduce inductance of the bonding wire as compared with the configuration in which the metal block is located directly below the bonding wire.

In addition, the configuration in which the metal block is located directly below the bonding wire (e.g., FIG. 7 of Patent Document 1), it is difficult to install the bonding wire before the metal block is installed. On the other hand, in the above semiconductor device, since the conductive member is located away from the bonding wire in the second direction in the planar view, the bonding wire can be assembled after the conductive member is installed or before the conductive member is installed. Therefore, the flexibility of manufacturing the semiconductor device is improved.

(2) In the semiconductor device according to one embodiment noted above under (1), the shortest distance from the conductive member to a top of the bonding wire may be less than or equal to the shortest distance from the ground plane to the top of the bonding wire.

According to the semiconductor device, since the conductive member is close to the bonding wire, an area in which the magnetic field from the bonding wire is blocked by the conductive member is increased. Therefore, inductance of the bonding wire can be further reduced.

(3) In the semiconductor device according to one embodiment noted above under (1), the maximum height of the conductive member from the ground plane may be greater than or equal to the height of the top of the bonding wire from the ground plane.

According to the semiconductor device, since a component of the magnetic field diagonally above the top of the bonding wire is blocked by the conductive member, the area in which the magnetic field from the bonding wire is blocked by the conductive member is increased. Therefore, inductance of the bonding wire can be further reduced.

(4) In the semiconductor device according to the embodiment noted above under (1), the conductive member may be positioned between the capacitor and the semiconductor chip in the planar view.

According to the semiconductor device, since the conductive member is close to the bonding wire, the area in which the magnetic field generated from the bonding wire is blocked by the conductive member is increased. Therefore, inductance of bonding wire can be further reduced.

(5) In the semiconductor device according to the embodiment noted above under (1), the conductive member may overlap with at least a portion of the bonding wire in a side view from the second direction.

According to the semiconductor device, since the area in which the magnetic field generated concentrically around at least part of the bonding wire is blocked by the conductive member is increased, inductance of the bonding wire can be further reduced.

(6) In the semiconductor device according to the embodiment noted above under (5), the conductive member may overlap with at least the top of the bonding wire in the side view from the second direction.

According to the semiconductor device, since the area in which the magnetic field generated concentrically around the top of the bonding wire is blocked by the conductive member is increased, inductance of the bonding wire can be further reduced.

(7) In the semiconductor device according to the embodiment noted above under (1), the conductive member may include a first conductive member and a second conductive member. The first conductive member may be positioned apart from the bonding wire in the second direction in the planar view. The second conductive member may be positioned apart from the bonding wire in a third direction opposite to the second direction in the planar view.

According to the semiconductor device, a portion of the magnetic field generated on the second direction side of the bonding wire is blocked by the first conductive member, and a portion of the magnetic field generated on the third direction side of the bonding wire is blocked by the second conductive member. As a result, the area in which the magnetic field generated from the bonding wire is blocked by the conductive members is increased, so that inductance of the bonding wire can be further reduced.

(8) The semiconductor device according to the embodiment noted above under (1) may further include a substrate provided on the ground plane and having an opening extending therethrough to the ground plane. The conductive member, the bonding wire, the capacitor, and the semiconductor chip may be arranged inside the opening.

According to the semiconductor device, since the conductive member, the bonding wire, the capacitor, and the semiconductor chip are disposed in the opening, an increase in thickness of the semiconductor device in the direction in which the planar view is taken can be suppressed even when the substrate is added on the ground plane.

(9) In the semiconductor device according to the embodiment noted above under (1), the semiconductor chip may be a transistor.

According to the semiconductor device, since impedance as viewed from the transistor can be matched by using the capacitor and the bonding wire, impedance matching is achieved for the fundamental and harmonics of the signal passing through the transistor. By inductance of the bonding wire being reduced, it is possible to suppress an increase in dispersion of the impedance with respect to the second harmonic. Thus, the impedance matching for the second harmonic can be performed with high accuracy over a wide band, which makes it possible to widen the frequency range in which the desired amplification efficiency of the transistor is achieved.

(10) An amplifier according to one embodiment of the present disclosure includes a ground plane, a first capacitor provided on the ground plane and having a first top surface, a first transistor provided on the ground plane and having a second top surface, at least one first bonding wire connecting the first top surface and the second top surface, a conductive member provided on the ground plane and electrically connected to the ground plane, a second capacitor provided on the ground plane and having a third top surface, a second transistor provided on the ground plane and having a fourth top surface, a plurality of second bonding wires connecting the third top surface and the fourth top surface, and a substrate provided on the ground plane and having an opening extending therethrough to the ground plane. The conductive member, the first capacitor, the first transistor, the first bonding wire, the second capacitor, the second transistor, and the second bonding wires are arranged inside the opening. The first transistor and the second transistor are connected in parallel to each other via the first capacitor and the second capacitor. The first transistor has a lower output power than the second transistor. The at least one first bonding wire is fewer in number than the second bonding wires. The at least one first bonding wire extends in a first direction in a planar view with respect to the ground plane. The conductive member is positioned apart from the at least one first bonding wire in a second direction intersecting orthogonally in the planar view with the first direction.

According to the amplifier, since the conductive member is located away from the at least one first bonding wire in the second direction in the plan view, at least part of lines of the magnetic force (magnetic field) generated concentrically around the at least one first bonding wire is blocked by the conductive member. Since at least part of the magnetic field from the at least one first bonding wire is blocked by the conductive member, inductance of the first bonding wire can be reduced.

According to the amplifier, since impedance as viewed from the first transistor can be matched by using the first capacitor and the at least one first bonding wire, impedance matching is achieved with respect to the fundamental and harmonics of the signal passing through the first transistor. Since impedance as viewed from the second transistor can be matched by using the second capacitor and the second bonding wires, impedance matching is achieved with respect to the fundamental and harmonics of the signal passing through the second transistor.

In the amplifier, the first transistor is a lower output type than the second transistor, and the at least one first bonding wire is fewer in number than the second bonding wires. Therefore, a change in inductance of the first bonding wire has a greater impact on the impedance matching of harmonics than a change in inductance of the second bonding wires. According to the above-noted amplifier, however, inductance of the first bonding wire is reduced, which makes it possible to suppress an increase in impedance dispersion with respect to the second harmonic of the signal passing through the first transistor. Thus, the impedance matching for the second harmonic can be performed with high accuracy over a wide band, thereby making it possible to widen the frequency range in which the desired amplification efficiency of the first transistor is achieved. As a result, a broadband amplifier that achieves desired amplifying efficiencies can be realized.

In the case of a configuration in which a metal block is located directly below the bonding wire (e.g., FIG. 7 of Patent Document 1), it is difficult to install the bonding wire before the metal block is installed. On the other hand, in the above amplifier described as (10), since the conductive member is positioned away from the first bonding wire in the second direction in the planar view, the first bonding wire can be installed even after the installation of the conductive member or before the installation. Therefore, flexibility in manufacturing the amplifier is improved.

Details of Embodiments of Present Disclosure

In the following, specific examples of the present disclosure will be described with reference to drawings. It should be noted that the present invention is not limited to these examples, but is specified by the claims, and is intended to include all modifications within the meaning and range equivalent to the claims.

Figure 2:
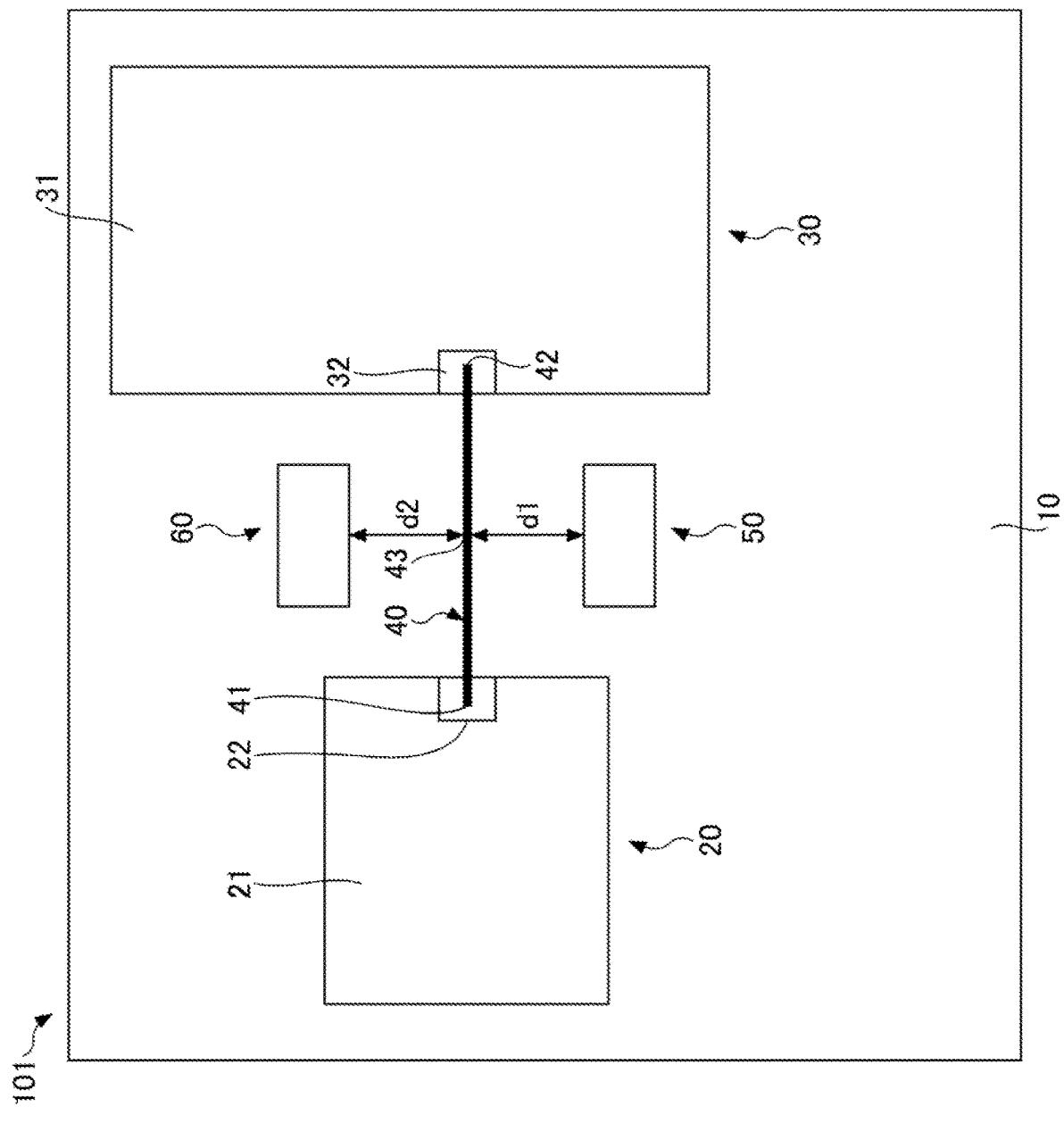
FIG. 2 is a plan view showing a configuration example of the semiconductor device according to the embodiment.

FIG. 1 is a perspective view showing a configuration example of a semiconductor device according to the first embodiment. FIG. 2 is a plan view showing the configuration example of the semiconductor device according to the first embodiment. Referring to FIGS. 1 and 2, the configuration of the semiconductor device in the first embodiment will be described.

Dimensions of members in the drawings may be depicted schematically for the sake of clear understanding and may not be necessarily to scale. In embodiments of the present disclosure, three-dimensional orthogonal coordinate system in the three-axis directions (i.e., X-axis direction, Y-axis direction, and Z-axis direction) is used. Deviation from a direction such as a parallel direction, a right-angle direction, an orthogonal direction, a horizontal direction, a vertical direction, an up and down direction, and a left and right direction is allowed to a degree that does not impair the effect of the embodiments of the present disclosure. The X-axis direction, the Y-axis direction, and the Z-axis direction represent a direction parallel to the X-axis, a direction parallel to the Y-axis, and a direction parallel to the Z-axis, respectively. The X-axis direction, the Y-axis direction, and the Z-axis direction are perpendicular to each other. The XY plane, the YZ plane, and the ZX plane represent a virtual plane parallel to both the X-axis direction and the Y-axis direction, a virtual plane parallel to both the Y-axis direction and the Z-axis direction, and a virtual plane parallel to both the Z-axis direction and the X-axis direction, respectively.

FIGS. 1 and 2 illustrate the semiconductor device 101. The semiconductor device 101 includes a ground plane 10, a capacitor 20, a semiconductor chip 30, a bonding wire 40, a first conductive member 50, and a second conductive member 60.

The ground plane 10 is a conductive plane for grounding. The ground plane 10 is, for example, a surface of a conductive plate or a surface of a conductive film made of copper or the like.

The capacitor 20 is a device provided on the ground plane 10, and has a first top surface 21. The capacitor 20 is, for example, a die capacitor having a back electrode in contact with the ground plane 10. Since the back electrode of the capacitor 20 is in contact with the ground plane 10, the back electrode of the capacitor 20 is grounded to the ground plane 10, and heat from the capacitor 20 is transferred to the ground plane 10. The capacitor 20 has a first electrode 22 formed in the first top surface 21. The capacitor 20 has a capacitive element between the first electrode 22 and the back electrode.

The semiconductor chip 30 is a device provided on the ground plane 10, and has a second top surface 31. The semiconductor chip 30 has a back electrode in contact with the ground plane 10. Since the back electrode of the semiconductor chip 30 is in contact with the ground plane 10, the back electrode of the semiconductor chip 30 is grounded to the ground plane 10, and heat of the semiconductor chip 30 is transferred to the ground plane 10. The semiconductor chip 30 has a second electrode 32 formed in the second top surface 31.

The semiconductor chip 30 is, for example, a transistor such as a GaN (gallium nitride) device. GaN devices have excellent high-frequency output characteristics as compared to other semiconductor devices (e.g., Si-LDMOS (silicon laterally diffused metal oxide semiconductor) and GaAs-FET (gallium arsenide field-effect transistor), because of their wide band gap and high mobility. The semiconductor chip 30 may be a semiconductor device other than a transistor (e.g., a diode).

The bonding wire 40 is a conductor connecting between the first top surface 21 and the second top surface 31, and has a first wire end 41 and a second wire end 42. The first wire end 41 is electrically connected to the first electrode 22 on the first top surface 21, and the second wire end 42 is electrically connected to the second electrode 32 on the second top surface 31. The bonding wire 40 has a top 43 which is a portion farthest from the ground plane 10. The bonding wire 40 is curved, with a peak at the top 43.

The first conductive member 50 and the second conductive member 60 are provided on the ground plane 10 and electrically connected to the ground plane 10. Shapes of the first and second conductive members 50 and 60 illustrated in FIG. 1 are rectangular parallelepiped, but other shapes may be used. Each of the first conductive member 50 and the second conductive member 60 has a surface facing to the bonding wire 40, and in the configuration in FIG. 1, has a surface parallel to the ZX plane.

When the surface of each of the first conductive member 50 and the second conductive member 60 is at least partially covered with a conductor such as gold plating, the inside thereof may not necessarily be formed of a conductor. The first conductive member 50 and the second conductive member 60 are fixed to the ground plane 10 by a conductive adhesive member such as silver-paste.

FIG. 2 shows the semiconductor device 101 in a planar view normal to the ground plane 10. In the planar view normal to the ground plane 10, a direction in which the bonding wire 40 extends is defined as a first direction, a direction perpendicular to the first direction is defined as a second direction, and a direction opposite the second direction is defined as a third direction. For example, in FIG. 2, a positive X-axis direction with respect to the capacitor 20 is an example of the first direction, a negative Y-axis direction with respect to the bonding wire 40 is an example of the second direction, a positive Y-axis direction with respect to the bonding wire 40 is an example of the third direction. In FIG. 2, the planar view normal to the ground plane 10 means a viewpoint from the normal direction (Z-axis direction) to the ground plane 10.

The first conductive member 50 is located away from the bonding wire 40 in the negative Y-axis direction in the planar view normal to the ground plane 10, and the second conductive member 60 is located away from the bonding wire 40 in the positive Y-axis direction in the planar view normal to the ground plane 10. Therefore, a portion of the magnetic field generated from the bonding wire 40 in the negative Y-axis direction is blocked by the first conductive member 50. A portion of the magnetic field generated from the bonding wire 40 in the positive Y-axis direction is blocked by the second conductive member 60. As a result, the magnetic field generated from the bonding wire 40 is blocked by the first conductive member 50 and the second conductive member 60 located on both sides of the bonding wire 40. Therefore, a degree to which inductance of the bonding wire 40 is reduced is higher than that in a configuration in which the conductive member is disposed only on one side of the bonding wire 40 (i.e., a configuration in which the second conductive member 60 is not provided).

One of the first conductive member 50 and the second conductive member 60 may not have to be provided. Even in such a configuration, the inductance of the bonding wire 40 can be reduced by the remaining conductive member.

The number of first conductive members 50 positioned away toward the negative Y-axis direction from the side surface of the bonding wire 40 on the negative Y-axis side is not limited to one, and may be plural. The number of second conductive members 60 positioned away toward the positive Y-axis direction from the side surface of the bonding wire 40 on the positive Y-axis side is not limited to one, and may be plural.

At least one conductive member among the first conductive member 50 and the second conductive member 60 may be located between the capacitor 20 and the semiconductor chip 30 in the planar view normal to the ground plane 10. With this arrangement, the at least one conductive member comes close to the bonding wire 40, resulting in an increase in the area in which the magnetic field generated from the bonding wire 40 is blocked by the at least one conductive member. Therefore, the inductance of the bonding wire 40 can be further reduced. In the configuration shown in FIG. 2, both the first conductive member 50 and the second conductive member 60 are located between the capacitor 20 and the semiconductor chip 30 in the planar view normal to the ground plane 10.

Figure 3:
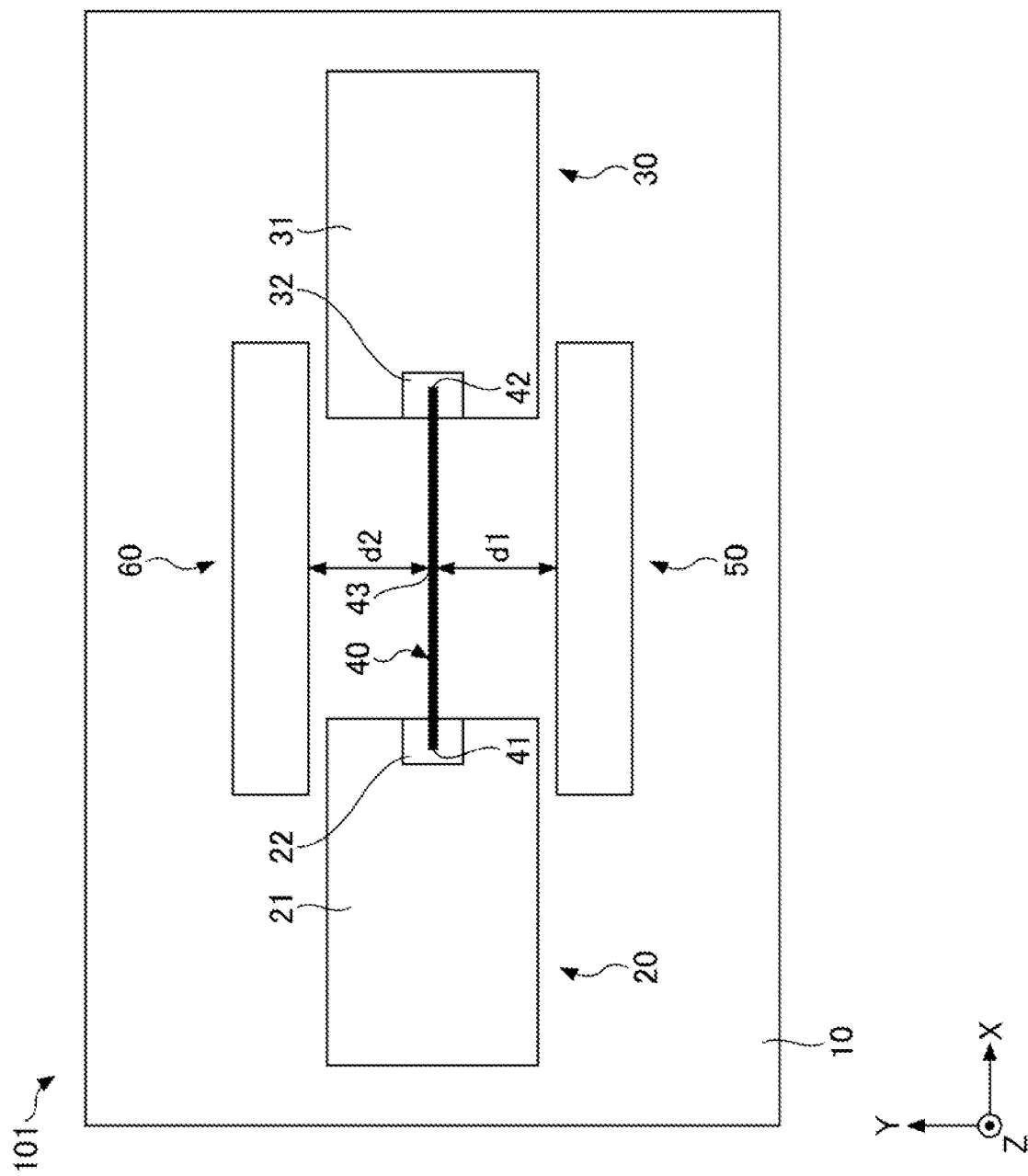
FIG. 3 is a plan view showing a configuration example of a semiconductor device according to a variation of the embodiment.

FIG. 3 is a plan view showing another configuration example of a semiconductor device according to the first embodiment. As shown in FIG. 3, neither the first conductive member 50 nor the second conductive member 60 may be located between the capacitor 20 and the semiconductor chip 30 in the planar view normal to the ground plane 10. Even in the configuration shown in FIG. 3, a portion of the magnetic field generated toward the negative Y-axis direction from the bonding wire 40 is blocked by the first conductive member 50, and a portion of the magnetic field generated toward the positive Y-axis direction from the bonding wire 40 is blocked by the second conductive member 60. Therefore, the configuration shown in FIG. 3 also reduces inductance of the bonding wire 40.

In the configuration shown in FIGS. 1 and 2, the shortest distance d1 from the first conductive member 50 to the top 43 of the bonding wire 40 is equal to or less than the shortest distance from the ground plane 10 to the top 43, e.g. the height h0 from the ground plane 10 to the lower face of the top 43. As a result, the area in which the magnetic field generated from the bonding wire 40 is blocked by the first conductive member 50 increases because the first conductive member 50 is closer to the bonding wire 40. Therefore, the inductance of the bonding wire 40 can be further reduced. Similarly, the shortest distance d2 from the second conductive member 60 to the top 43 of the bonding wire 40 may be less than or equal to the shortest distance from the ground plane 10 to the top 43, e.g., the height h0 from the ground plane 10 to the lower face of the top 43. As a result, the inductance of the bonding wire 40 can be further reduced.

Figure 4:
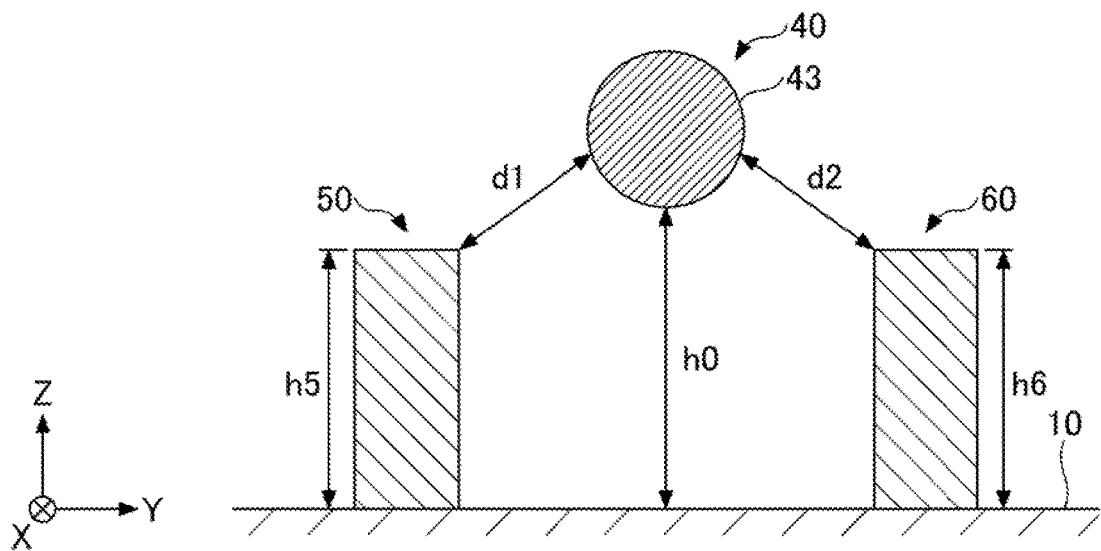
FIG. 4 is a diagram for explaining positional relation between conductive members and a bonding wire.

FIG. 4 is a diagram illustrating a first exemplary positional relation between the conductive members and the bonding wire. As shown in FIG. 4, the highest height h5 of the first conductive member 50 from the ground plane 10 is may be less than the height of the top 43 of the bonding wire 40 from the ground plane 10, e.g., the height h0 from the ground plane 10 to the lower face of the top 43. Even in the configuration shown in FIG. 4, since the magnetic field generated concentrically around the top 43 can be blocked by the first conductive member 50, the inductance of the bonding wire 40 can be reduced.

As shown in FIG. 4, the highest height h6 of the second conductive member 60 from the ground plane 10 may be less than the height of the top 43 of the bonding wire 40 from the ground plane 10, e.g., the height h0 from the ground plane 10 to the lower face of the top 43. Similarly to the case of the first conductive member 50, the inductance of the bonding wire 40 can be reduced.

Figure 5:
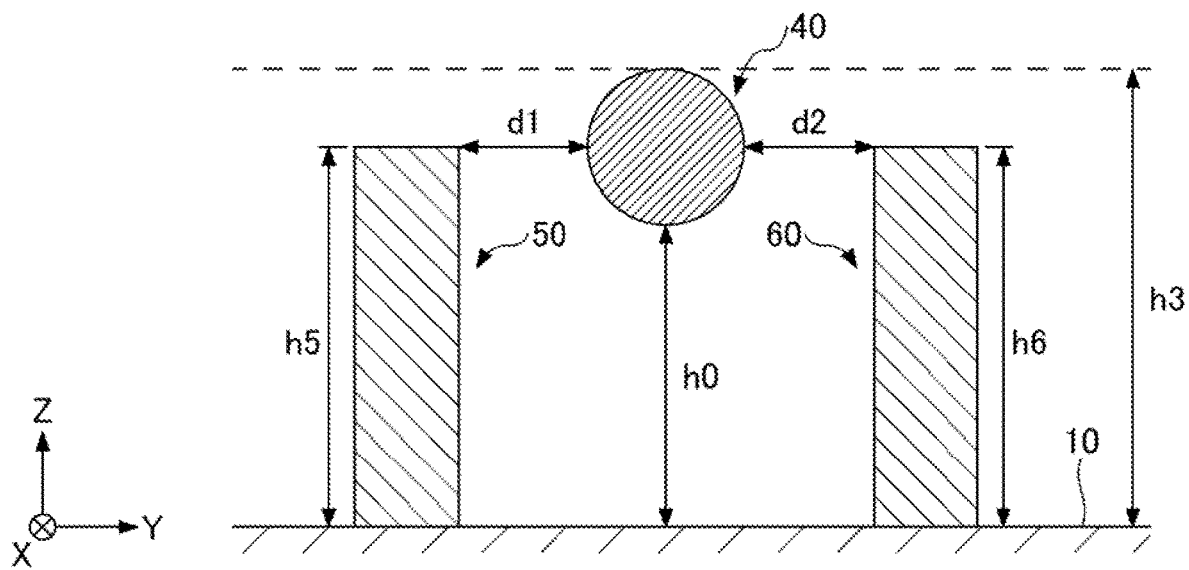
FIG. 5 is a diagram for explaining positional relation between conductive members and a bonding wire.

FIG. 5 is a diagram illustrating a second exemplary positional relation between the conductive members and the bonding wire. As shown in FIG. 5, the highest height h5 of the first conductive member 50 from the ground plane 10 may be equal to or greater than the height h0 and less than a height h3. The height h0 represents a height from the ground plane 10 to the lower face of the top 43, and the height h3 represents a height from the ground plane 10 to the upper face of the top 43. Even in the configuration shown in FIG. 5, since the magnetic field generated concentrically around the top 43 can be blocked by the first conductive member 50, the inductance of the bonding wire 40 can be reduced. Similarly, in the case in which the highest height h6 of the second conductive member 60 from the ground plane 10 is equal to or greater than the height h0 and less than the height h3, the inductance of the bonding wire 40 can be reduced.

Figure 6:
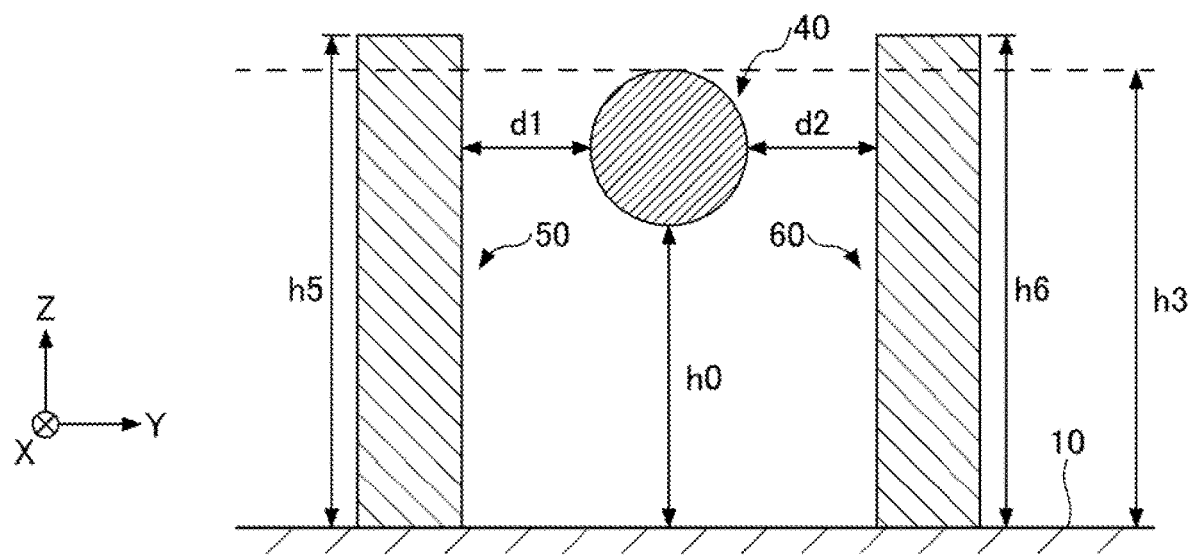
FIG. 6 is a diagram for explaining positional relation between conductive members and a bonding wire.

FIG. 6 is a diagram illustrating a third exemplary positional relation between the conductive members and the bonding wire. As shown in FIG. 6, the highest height h5 of the first conductive member 50 from the ground plane 10 may be equal to or greater than the height h3. Even in the configuration shown in FIG. 6, since the magnetic field generated concentrically around the top 43 can be blocked by the first conductive member 50, the inductance of the bonding wire 40 can be reduced. Similarly, in the case in which the highest height h6 of the second conductive member 60 from the ground plane 10 is equal to or greater than the height h3, the inductance of the bonding wire 40 can be reduced.

Figure 7:
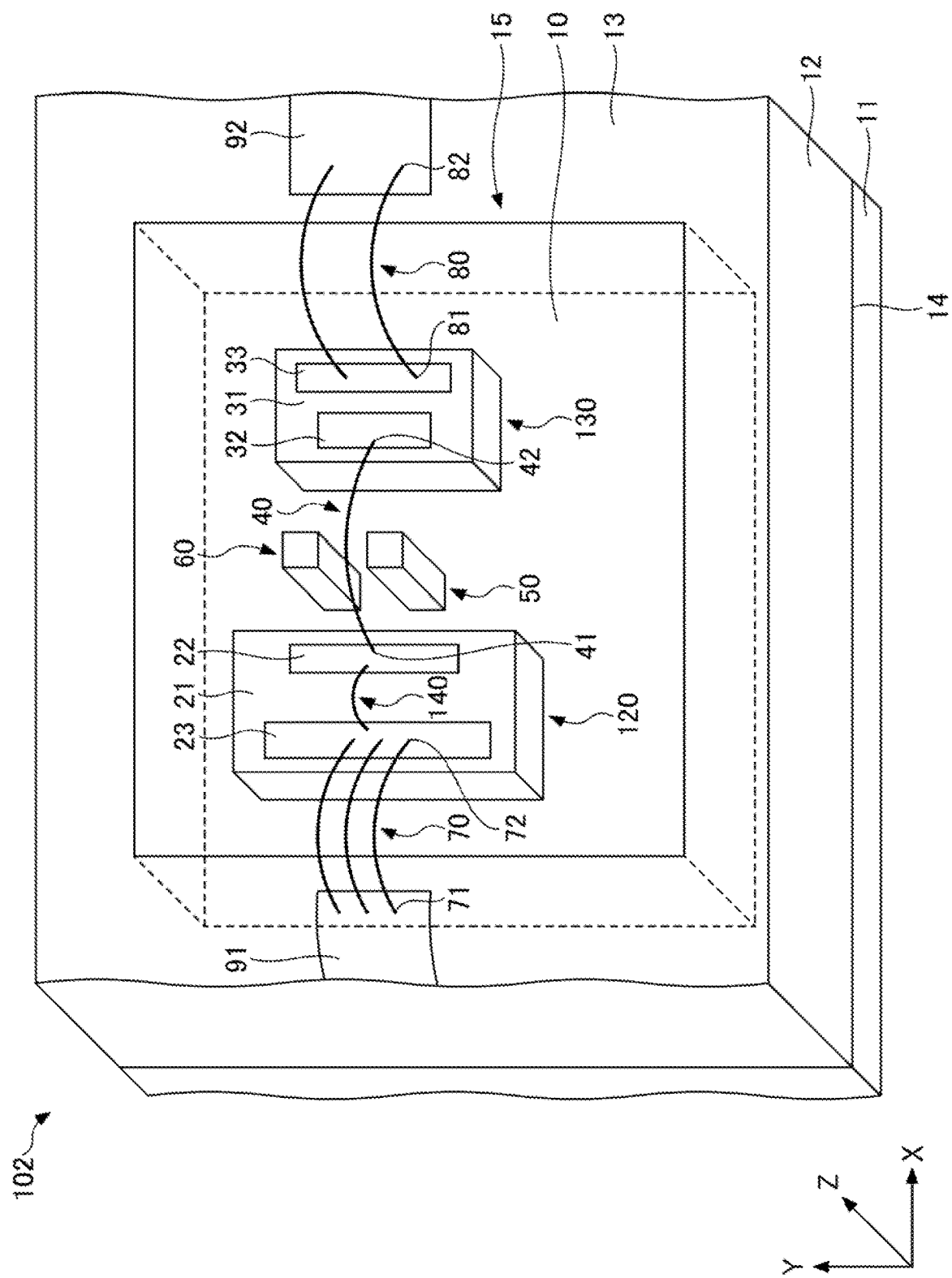
FIG. 7 is a perspective view showing a configuration example of a semiconductor device according to another embodiment.
Figure 8:
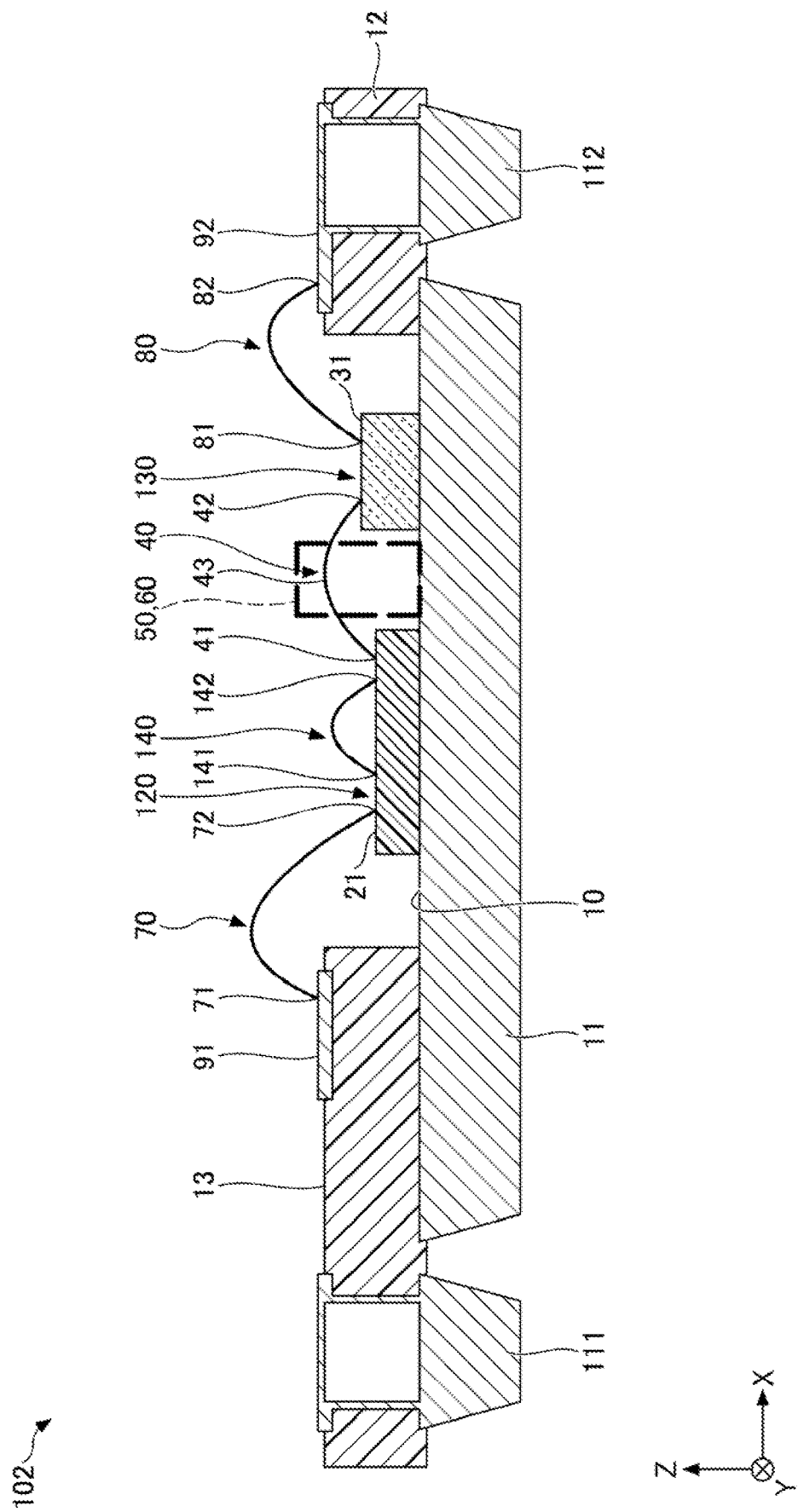
FIG. 8 is a cross-sectional view showing a configuration example of the semiconductor device according to the embodiment.

FIG. 7 is a perspective view illustrating an exemplary configuration of a semiconductor device according to the second embodiment. FIG. 8 is a cross-sectional view illustrating an exemplary configuration of the semiconductor device according to the second embodiment. Referring to FIGS. 7 and 8, exemplary configurations of the semiconductor device according to the second embodiment will be described. The description of the same configuration as that of the previous embodiment is omitted or simplified in view of the previous descriptions.

As shown in FIGS. 7 and 8, a semiconductor device 102 includes a conductive plate 11, a capacitor 120, a first transistor 130, a bonding wire 40, a first conductive member 50, a second conductive member 60, and a substrate 12. The first transistor 130 is an example of the semiconductor chip.

The top surface of the conductive plate 11 is the ground plane 10. The conductive plate 11 is, for example, a copper plate.

The substrate 12 is, for example, a dielectric substrate provided on the ground plane 10. The substrate 12 has a substrate top surface 13 and a substrate bottom surface 14. The substrate bottom surface 14 is in contact with the ground plane 10. The substrate 12 has an opening 15 extending therethrough to the ground plane 10. The opening 15 is, for example, a hole that penetrates the substrate 12 from the substrate top surface 13 to the substrate bottom surface 14, and is also referred to as a cavity. The opening 15 is not limited to a complete hole, but may be open to one side. The ground plane 10 is exposed through the opening 15.

The first conductive member 50, the second conductive member 60, the bonding wire 40, the capacitor 120, and the first transistor 130 are arranged in the opening 15. Since the first conductive member 50 and the like are disposed in the opening 15, even if the substrate 12 provided on the ground plane 10 is present, an increase in thickness of the semiconductor device 102 in the side view can be suppressed.

The capacitor 120 has a first top surface 21 on which a first electrode 22 and a third electrode 23 are formed. The capacitor 120 has a first capacitive element formed between the first electrode 22 and a back electrode formed on a back surface of the capacitor 120. The capacitor 120 has a second capacitive element formed between the third electrode 23 and the back electrode.

A bonding wire 140 is a conductor connecting between the first electrode 22 and the third electrode 23, with a wire end 141 electrically connected to the third electrode 23, and a wire end 142 electrically connected to the first electrode 22.

A bonding wire 70 is a conductor that connects between the first top surface 21 and the substrate top surface 13. The bonding wire 70 has a wire end 71 that is electrically connected to an electrode 91 on the substrate top surface 13 and a wire end 72 that is electrically connected to the third electrode 23 on the first top surface 21. The electrode 91 is electrically connected to an input terminal 111 directly, or electrically connected to the input terminal 111 via one or more parts which are not shown.

The first transistor 130 has a second top surface on which a second electrode 32 and a fourth electrode 33 are formed. For example, the second electrode 32 is a gate electrode, and the fourth electrode 33 is a drain electrode.

A bonding wire 80 is a conductor that connects between the second top surface 31 and the substrate top surface 13. The bonding wire 80 has a wire end 81 that is electrically connected to the fourth electrode 33 on the second top surface 31 and a wire end 82 that is electrically connected to an electrode 92 on the substrate top surface 13. The electrode 92 is electrically connected to a main output terminal 112.

In FIG. 8, the first conductive member 50 and the second conductive member 60 overlap with at least part of the bonding wire 40 in a side view seen in the Y-axis direction. As a result, the area in which the magnetic field generated concentrically around at least part of the bonding wire 40 is blocked by the first conductive member 50 and the second conductive member 60 is increased, so that inductance of the bonding wire 40 can be further reduced.

In FIG. 8, the first conductive member 50 and the second conductive member 60, in the side view seen in the Y-axis direction, overlap with at least the top 43 of the bonding wire 40. As a result, the area in which the magnetic field generated concentrically around the top 43 is blocked by the first conductive member 50 and the second conductive member 60 is increased, so that inductance of the bonding wire 40 can be further reduced.

Figure 9:
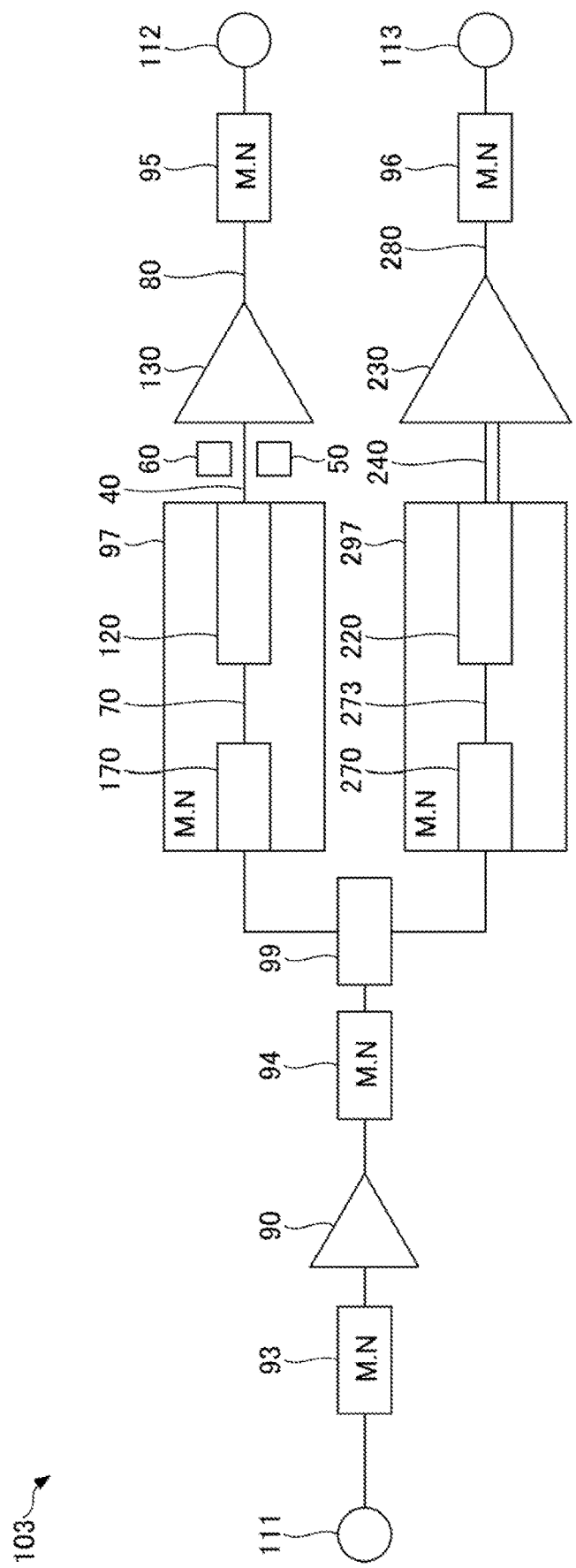
FIG. 9 is a circuit block diagram showing a configuration example of an amplifier according to one embodiment.

FIG. 9 is a circuit diagram illustrating an exemplary configuration of an amplifier according to an embodiment. Configurations similar to those of the previously-described embodiments will be omitted or simplified in view of the previous descriptions. As shown in FIG. 9, an amplifier 103 is a Doherty-type amplifier in which a first transistor 130 and a second transistor 230 are connected in parallel to each other via a first capacitor 120 and a second capacitor 220.

The amplifier 103 includes an input circuit, and the input circuit includes an input terminal 111, a matching circuit 93, a driver amplifier 90, a matching circuit 94, and a splitter 99. The amplifier 103 includes a carrier amplifying circuit, and the carrier amplifying circuit includes a matching circuit 97, a first bonding wire 40, the first transistor 130, a bonding wire 80, a matching circuit 95, and a main output terminal 112. The amplifier 103 includes a peak amplifying circuit, and the peak amplifying circuit includes a matching circuit 297, second bonding wires 240, the second transistor 230, a bonding wire 280, a matching circuit 96, and a peak output terminal 113. The amplifier 103 further includes a first conductive member 50 and a second conductive member 60.

The matching circuit 97 has a filter section 170, a bonding wire 70, and the first capacitor 120. The matching circuit 297 has a filter section 270, a bonding wire 273, and the second capacitor 220. The matching circuit 97 and the matching circuit 297 have the same circuit configuration.

Figure 10:
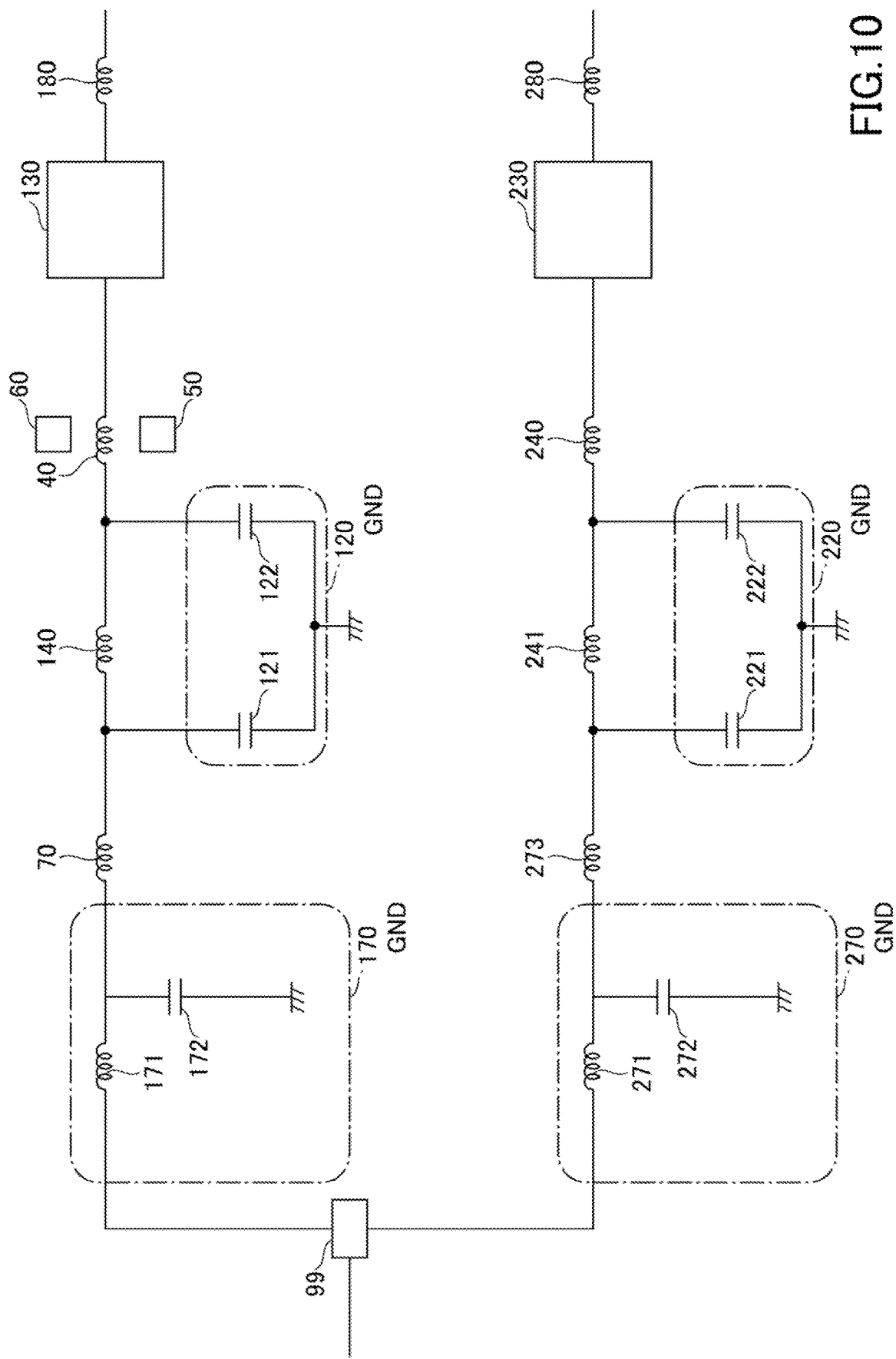
FIG. 10 is a circuit diagram showing a configuration example of part of the amplifier according to the embodiment.

As shown in FIG. 10, the filter section 170 has an inductor 171 and a capacitor 172, and the filter section 270 has an inductor 271 and a capacitor 272. The first capacitor 120 has a first capacitive element 121 and a second capacitive element 122. One ends of the first capacitive element 121 and the second capacitive element 122 are connected to each other via a bonding wire 140. The second capacitor 220 has a third capacitive element 221 and a fourth capacitive element 222. One ends of the third capacitive element 221 and the fourth capacitive element 222 are connected to each other via a bonding wire 241.

The first conductive member 50, the second conductive member 60, the first capacitor 120, the first transistor 130, the first bonding wire 40, the second capacitor 220, the second transistor 230, and the second bonding wires 240 are arranged in the opening 15 (see FIG. 7). The above-described components other than those disposed in the opening 15 are mounted on the substrate 12.

In FIG. 9, the first transistor 130 is a lower output type compared to the second transistor 230, i.e., the first transistor 130 outputs a lower output power than the second transistor 230. The first bonding wire 40 is fewer in number than the second bonding wires 240. At least one first bonding wire 40 (e.g., one) is provided, and the number of second bonding wires 240 is two or more (e.g., two). Therefore, a change in inductance of the first bonding wire 40 has a larger impact on the impedance matching of harmonics than a change in inductance of the second bonding wires 240. According to the amplifier 103, however, the inductance of the first bonding wire 40 is reduced, which makes it possible to suppress an increase in the dispersion of the impedance with respect to the second harmonic of the signal passing through the first transistor 130. Thus, the impedance matching for the second harmonic can be performed with high accuracy over a wide band, thereby making it possible to widen the frequency range in which the desired amplification efficiency of the first transistor 130 is achieved. As a result, the amplifier 103 achieves desired amplifying efficiencies in a wide frequency range.

The larger the area for blocking the magnetic field generated from a bonding wire, the larger the inductance reduction effect with respect to the bonding wire becomes. Thus, the inductance reduction effect increases with a decrease in the number of wires, and is the greatest in the case of one wire.

Figures 11, 12:
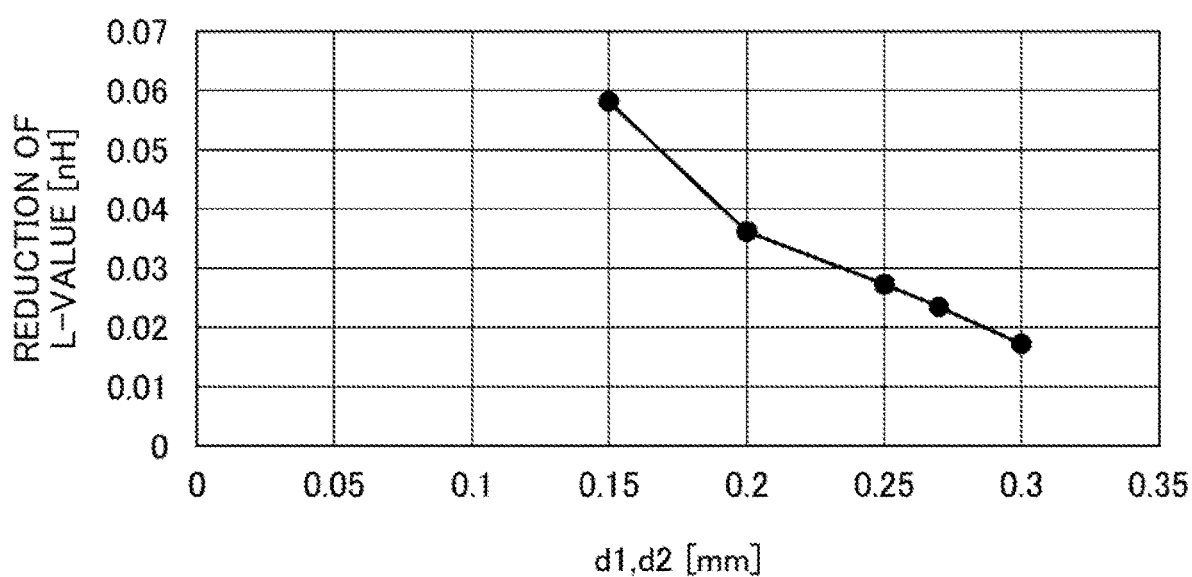
FIG. 11 is a table showing an example of simulation results.
FIG. 12 is a graph showing an example of simulation results.

FIG. 11 is a table showing an example of simulation results. FIG. 12 is a graph showing an example of the simulation results shown in FIG. 11. FIGS. 11 and 12 show the inductances (L-values) of the bonding wire 40 and reductions thereof in the case in which both of the shortest distances d1 and d2 are changed while the height h0 is fixed to 0.27 mm in the configuration illustrated in FIG. 1. In FIG. 11, the entry "∞" at the column "d1, d2" corresponds to a comparative configuration in which the first conductive member 50 and the second conductive member 60 are removed from the configuration shown in FIG. 1. The column "REDUCTION OF L-VALUE" represents a difference of each L-value from the L-value of the comparative configuration. By decreasing the shortest distances d1 and d2 to below the height h0, the reduction of the L-value is increased.

What is claimed is:

1. A semiconductor device comprising:
a ground plane;
a capacitor disposed on the ground plane, the capacitor having a first top surface;
a semiconductor chip disposed on the ground plane, the semiconductor chip having a second top surface;
a bonding wire connecting the first top surface and the second top surface; and
a conductive member, disposed on the ground plane, the conductive member being electrically connected to the ground plane,
wherein the bonding wire extends in a first direction in a planar view normal to the ground plane, and
wherein the conductive member comprises a first conductive member and a second conductive member that are spaced apart from each other in a second direction orthogonally intersecting in the planar view with the first direction such that the bonding wire is between the first conductive member and the second conductive member.

2. The semiconductor device according to claim 1, wherein a shortest distance from the conductive member to a top of the bonding wire is less than or equal to a shortest distance from the ground plane to the top of the bonding wire.

3. The semiconductor device according to claim 1, wherein a highest height of the conductive member from the ground plane is greater than or equal to a height of the top of the bonding wire from the ground plane.

4. The semiconductor device according to claim 1, wherein the conductive member is positioned between the capacitor and the semiconductor chip in the planar view.

5. The semiconductor device according to claim 1, wherein the conductive member partially overlaps with the bonding wire in a side view seen in the second direction.

6. The semiconductor device according to claim 5, wherein the conductive member overlaps with the top of the bonding wire in the side view seen in the second direction.

7. The semiconductor device according to claim 1, wherein the conductive member includes a first conductive member and a second conductive member,
wherein the first conductive member is positioned apart from the bonding wire in the second direction in the planar view,
wherein the second conductive member is positioned apart from the bonding wire in a third direction opposite to the second direction in the planar view.

8. The semiconductor device according to claim 1 further comprising:

a substrate disposed on the ground plane, the substrate having an opening extending therethrough to the ground plane, wherein the conductive member, the bonding wire, the capacitor, and the semiconductor chip are arranged inside the opening.

9. The semiconductor device according to claim 1, wherein the semiconductor chip includes a transistor.

10. An amplifier comprising:

a ground plane;

a first capacitor disposed on the ground plane, the first capacitor having a first top surface;

a first transistor disposed on the ground plane, the first transistor having a second top surface;

at least one first bonding wire connecting the first top surface and the second top surface; a conductive member disposed on the ground plane, the conductive member being electrically connected to the ground plane;

a second capacitor disposed on the ground plane, the second capacitor having a third top surface;

a second transistor disposed on the ground plane, the second transistor having a fourth top surface;

a plurality of second bonding wires connecting the third top surface and the fourth top surface; and a substrate disposed on the ground plane, the substrate having an opening extending therethrough to the ground plane, wherein the conductive member, the first capacitor, the first transistor, the at least one first bonding wire, the second capacitor, the second transistor, and the second bonding wires are arranged inside the opening, wherein the first transistor and the second transistor are connected in parallel to each other via the first capacitor and the second capacitor, wherein the first transistor has a lower output power than the second transistor, wherein the at least one first bonding wire is fewer in number than the second bonding wires, wherein the first bonding wire extends in a first direction in a planar view normal to the ground plane, and wherein the conductive member comprises a first conductive member and a second conductive member that are spaced apart from each other in a second direction orthogonally intersecting in the planar view with the first direction such that the bonding wire is between the first conductive member and the second conductive member.

* * * * *